US009589999B2

(12) United States Patent
Yang

(10) Patent No.: US 9,589,999 B2
(45) Date of Patent: Mar. 7, 2017

(54) LTPS TFT PIXEL UNIT AND MANUFACTURE METHOD THEREOF

(71) Applicant: Shenzhen China Star Optoelectronics Technology Co., Ltd., Shenzhen, Guangdong (CN)

(72) Inventor: Zuyou Yang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 117 days.

(21) Appl. No.: 14/433,663

(22) PCT Filed: Jan. 28, 2015

(86) PCT No.: PCT/CN2015/071708
§ 371 (c)(1),
(2) Date: Apr. 4, 2015

(87) PCT Pub. No.: WO2016/106923
PCT Pub. Date: Jul. 7, 2016

(65) Prior Publication Data
US 2016/0343749 A1  Nov. 24, 2016

(30) Foreign Application Priority Data

Dec. 31, 2014  (CN) .......................... 2014 1 0856610

(51) Int. Cl.
| H01L 27/12 | (2006.01) |
| H01L 29/66 | (2006.01) |
| G02F 1/1333 | (2006.01) |
| H01L 21/77 | (2006.01) |
| H01L 21/02 | (2006.01) |

(Continued)

(52) U.S. Cl.
CPC ........ *H01L 27/1296* (2013.01); *G02F 1/1333* (2013.01); *H01L 21/0217* (2013.01); *H01L 21/02164* (2013.01); *H01L 21/02532* (2013.01); *H01L 21/02592* (2013.01); *H01L 21/02667* (2013.01); *H01L 21/31055* (2013.01); *H01L 21/77* (2013.01); *H01L 27/12* (2013.01); *H01L 27/1248* (2013.01); *H01L 27/1262* (2013.01);

(Continued)

(58) Field of Classification Search
CPC combination set(s) only.
See application file for complete search history.

(56) References Cited

U.S. PATENT DOCUMENTS

2009/0155979 A1* 6/2009 Son ................. H01L 21/823412
                                                            438/430
2011/0261019 A1* 10/2011 Makita .................... H01L 27/12
                                                            345/175

(Continued)

*Primary Examiner* — Mamadou Diallo
(74) *Attorney, Agent, or Firm* — Andrew C. Cheng

(57) ABSTRACT

The present invention discloses a LTPS TFT pixel unit and a manufacture method thereof. The method comprises steps of: providing a substrate and forming a buffer layer on the substrate; forming a semiconductor pattern layer and a first insulative layer on the buffer layer, and the semiconductor pattern layer and the first insulative layer are located in the same layer and heights of the semiconductor pattern layer and the first insulative layer are the same. With the aforesaid arrangement, the present invention can reduce the side effect of the LTPS TFT pixel unit and promote the electrical property thereof.

11 Claims, 3 Drawing Sheets

(51) Int. Cl.
*H01L 21/3105* (2006.01)
*H01L 29/786* (2006.01)

(52) U.S. Cl.
CPC .. H01L 29/66757 (2013.01); *H01L 29/78621* (2013.01)

(56) References Cited

U.S. PATENT DOCUMENTS

| | | | | |
|---|---|---|---|---|
| 2012/0326143 | A1* | 12/2012 | Tsurume | H01L 27/1225 257/43 |
| 2013/0032803 | A1* | 2/2013 | Moon | H01L 51/5271 257/59 |
| 2015/0102336 | A1* | 4/2015 | Kang | H01L 27/1225 257/43 |
| 2015/0179724 | A1* | 6/2015 | Lee | H01L 27/3241 257/40 |
| 2016/0126494 | A1* | 5/2016 | Jung | H01L 27/3258 257/72 |
| 2016/0181289 | A1* | 6/2016 | Long | H01L 21/77 257/71 |

* cited by examiner

LTPS TFT PIXEL UNIT AND MANUFACTURE METHOD THEREOF

FIELD OF THE INVENTION

The present invention relates to a display technology field, and more particularly to a LTPS TFT pixel unit and a manufacture method thereof.

BACKGROUND OF THE INVENTION

The formation procedure of the LTPS TFT (Low Temperature Poly-silicon Thin Film Transistor) according to prior arts is: first deposing the buffer layer, and forming the semiconductor pattern layer. Furthermore, other elements of the LTPS TFT pixel unit, such as the insulative layer, the gate, etc. are formed on the semiconductor pattern layer.

Because the semiconductor pattern layer is formed on the buffer layer in the LTPS TFT pixel unit according to prior arts, that is to say, the semiconductor pattern layer is convex upward from the buffer layer, and the latter formed insulative layer forms stepped convex structures at two ends of the semiconductor pattern layer. Thus, the gaps of the gate and the semiconductor pattern layer formed on the buffer layer is not even to cause side effect. On the other hand, the stepped structures of the buffer layer exists, the signals becomes unstable in the transmission, and thus influences the electrical property of the LTPS TFT pixel unit.

SUMMARY OF THE INVENTION

An objective of the present invention is to provide a LTPS TFT pixel unit, which can reduce the side effect and promote the electrical property thereof.

For solving the aforesaid objectives, a technical solution employed by the present invention is: providing a manufacture method of the LTPS TFT pixel unit, and the method comprises steps of: providing a substrate and forming a buffer layer on the substrate; forming a semiconductor pattern layer and a first insulative layer on the buffer layer, and the semiconductor pattern layer and the first insulative layer are located in the same layer and heights of the semiconductor pattern layer and the first insulative layer are the same; wherein the step of forming a buffer layer on the substrate comprises: sequentially forming a silicon nitride layer and a silicon oxide layer on the substrate; the step of forming a semiconductor pattern layer and a first insulative layer on the buffer layer, and the semiconductor pattern layer and the first insulative layer are located in the same layer and heights of the semiconductor pattern layer and the first insulative layer are the same comprises: forming an amorphous silicon layer on the buffer layer, and implementing crystallization operation to the amorphous silicon layer to form a polysilicon layer; patterning the amorphous silicon layer with a first photolithography process to form the semiconductor pattern layer; forming a silicon nitride layer, of which a height is the same as the height of the semiconductor pattern layer on the semiconductor pattern layer and the buffer layer where the semiconductor pattern layer is not formed; coating negative photoresist on the silicon nitride layer at a location not corresponding to the semiconductor pattern layer; patterning the silicon nitride layer with a second photolithography process; further etching the silicon nitride layer on the semiconductor pattern layer to etching remove the silicon nitride layer on the semiconductor pattern layer for forming the first insulative layer, of which a height is the same as the height of the semiconductor pattern layer at two ends of the semiconductor pattern layer.

The method further comprises steps of forming a normal area and heavy doped areas at two sides of the normal area on the semiconductor pattern layer with a third photolithography process and a first doping process; further forming a light doped area between the normal area and the heavy doped areas on the semiconductor pattern layer with a fourth photolithography process and a second doping process.

The method further comprises steps of forming a second insulative layer on the semiconductor pattern layer and the first insulative layer; forming a gate layer on the second insulative layer, and patterning the gate layer with a fifth photolithography process to form a gate; forming a third insulative layer on the gate; forming a source and a drain of the LTPS TFT unit on the third insulative layer, wherein the source and the drain are respectively connected to the semiconductor pattern layer with first via holes penetrating the second insulative layer and the third insulative layer; forming a fourth insulative layer on the source and the drain, and forming a pixel electrode on the fourth insulative layer, and the pixel electrode is electrically connected to one of the source and the drain with a second via hole penetrating the fourth insulative layer.

The further comprises steps of forming a fifth insulative layer between the fourth insulative layer and the source, the drain; further forming a common electrode between the fifth insulative layer and the fourth insulative layer, employed to form a liquid crystal capacitor with the pixel electrode.

For solving the aforesaid objectives, another technical solution employed by the present invention is: providing a manufacture method of a LTPS TFT pixel unit, and the method comprises steps of: providing a substrate and forming a buffer layer on the substrate; forming a semiconductor pattern layer and a first insulative layer on the buffer layer, and the semiconductor pattern layer and the first insulative layer are located in the same layer and heights of the semiconductor pattern layer and the first insulative layer are the same.

The step of forming a buffer layer on the substrate comprises a step of: sequentially forming a silicon nitride layer and a silicon oxide layer on the substrate.

The step of forming a semiconductor pattern layer and a first insulative layer on the buffer layer, and the semiconductor pattern layer and the first insulative layer are located in the same layer and heights of the semiconductor pattern layer and the first insulative layer are the same comprises: forming an amorphous silicon layer on the buffer layer, and implementing crystallization operation to the amorphous silicon layer to form a polysilicon layer; patterning the amorphous silicon layer with a first photolithography process to form the semiconductor pattern layer; forming a silicon nitride layer, of which a height is the same as the height of the semiconductor pattern layer on the semiconductor pattern layer and the buffer layer where the semiconductor pattern layer is not formed; coating negative photoresist on the silicon nitride layer at a location not corresponding to the semiconductor pattern layer; patterning the silicon nitride layer with a second photolithography process; further etching the silicon nitride layer on the semiconductor pattern layer to etching remove the silicon nitride layer on the semiconductor pattern layer for forming the first insulative layer, of which a height is the same as the height of the semiconductor pattern layer at two ends of the semiconductor pattern layer.

The method further comprises steps of forming a normal area and heavy doped areas at two sides of the normal area on the semiconductor pattern layer with a third photolithography process and a first doping process; further forming a light doped area between the normal area and the heavy doped areas on the semiconductor pattern layer with a fourth photolithography process and a second doping process.

The method further comprises steps of forming a second insulative layer on the semiconductor pattern layer and the first insulative layer; forming a gate layer on the second insulative layer, and patterning the gate layer with a fifth photolithography process to form a gate; forming a third insulative layer on the gate; forming a source and a drain of the LTPS TFT unit on the third insulative layer, wherein the source and the drain are respectively connected to the semiconductor pattern layer with first via holes penetrating the second insulative layer and the third insulative layer; forming a fourth insulative layer on the source and the drain, and forming a pixel electrode on the fourth insulative layer, and the pixel electrode is electrically connected to one of the source and the drain with a second via hole penetrating the fourth insulative layer.

The further comprises steps of forming a fifth insulative layer between the fourth insulative layer and the source, the drain; further forming a common electrode between the fifth insulative layer and the fourth insulative layer, employed to form a liquid crystal capacitor with the pixel electrode.

For solving the aforesaid objectives, another technical solution employed by the present invention is: providing a LTPS TFT pixel unit, and the LTPS TFT pixel unit comprises: a substrate; a buffer layer, located on the substrate; a semiconductor pattern layer and a first insulative layer, located in the same layer and heights of the semiconductor pattern layer and the first insulative layer are the same.

The buffer layer comprises a silicon nitride layer and a silicon oxide layer sequentially formed on the substrate.

The LTPS TFT pixel unit further comprises: a second insulative layer, located on the semiconductor pattern layer and the first insulative layer; a gate, located on the second insulation layer; a third insulative layer, located on the gate; a source and a drain, located on the third insulative layer, wherein the source and the drain are respectively connected to the semiconductor pattern layer with first via holes penetrating the second insulative layer and the third insulative layer; a fourth insulative layer, located on the source and the drain; a pixel electrode, located on the fourth insulative layer, and the pixel electrode is electrically connected to one of the source and the drain with a second via hole penetrating the fourth insulative layer.

The LTPS TFT pixel unit further comprises: a fifth insulative layer, located between the fourth insulative layer and the source, the drain; a common electrode, located between the fifth insulative layer and the fourth insulative layer, and employed to form a liquid crystal capacitor with the pixel electrode.

The benefits of the present invention are: different from the condition of prior arts, the present invention forms a semiconductor pattern layer and a first insulative layer, which are located in the same layer and heights are the same so that the second insulative layer latter formed can be in a flat state without convex structures. Thus, the gate layer can be on the flat second insulative layer to ensure the consistent gap of the semiconductor pattern layer and prevent the side effects due to the uneven gap between the gate layer and the semiconductor pattern layer caused by some convex structures of the second insulative layer. Meanwhile, the electrical property of the LTPS TFT pixel unit can be promoted.

DETAILED DESCRIPTION OF PREFERRED EMBODIMENTS

Figure 1:
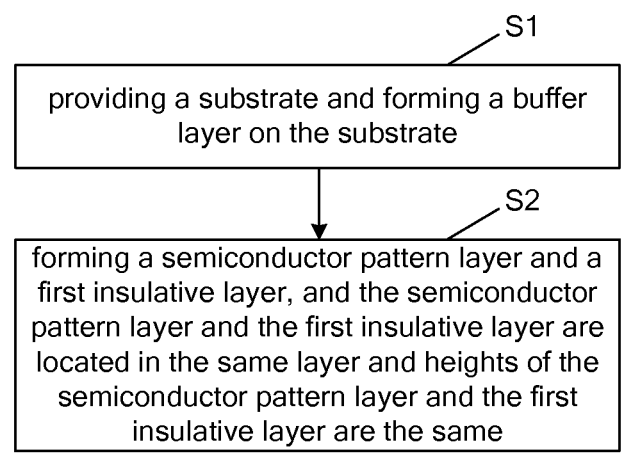
FIG. 1 is a flowchart of a manufacture method of a TFT pixel unit provided by the embodiment of the present invention.
Figure 2:
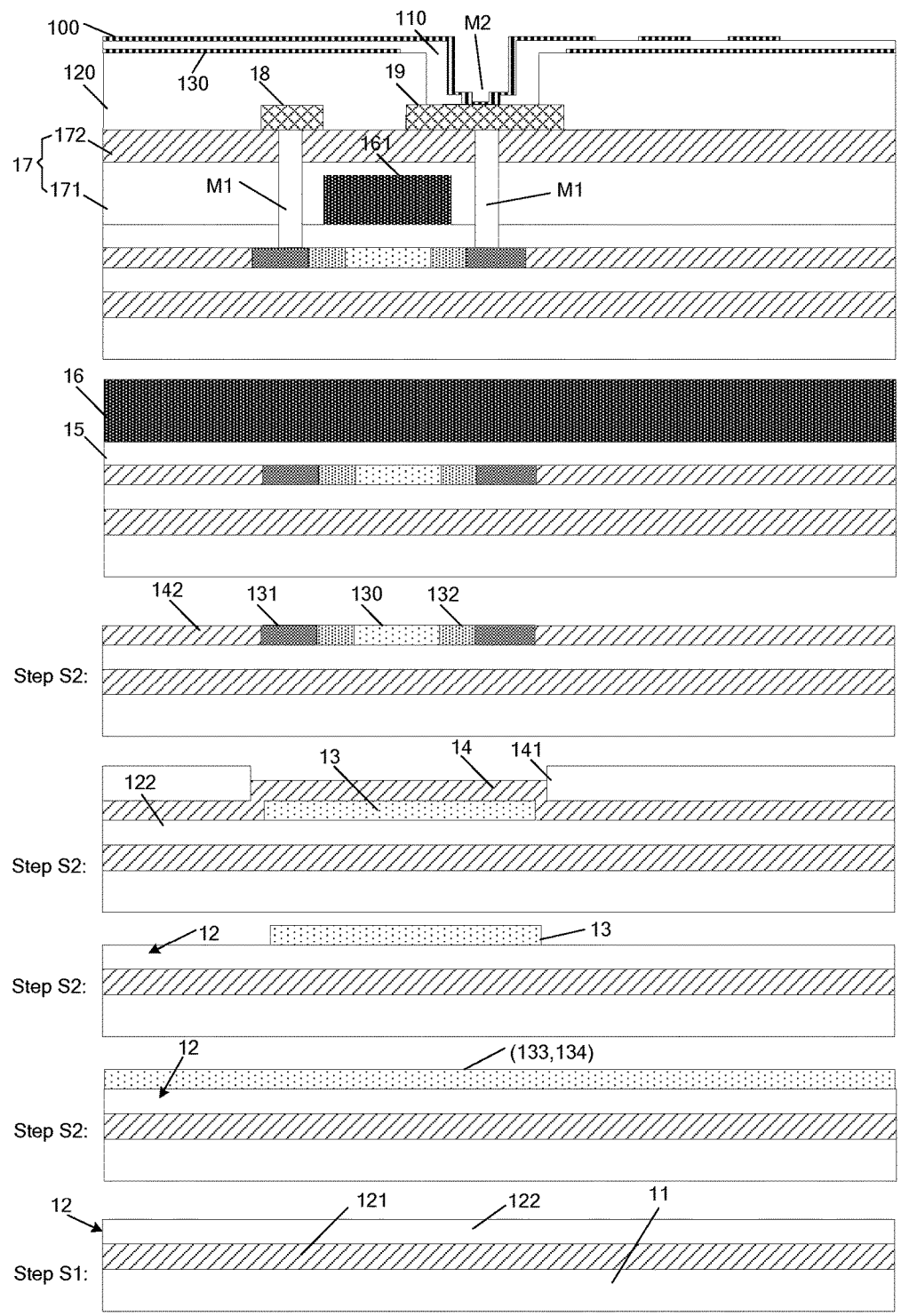
FIG. 2 is a process diagram corresponding to the method shown in FIG. 1.

Please refer to FIG. 1 and FIG. 2. FIG. 1 is a flowchart of a manufacture method of a TFT pixel unit provided by the embodiment of the present invention, and FIG. 2 is a process diagram corresponding to the method shown in FIG. 1. As shown in FIG. 1 and FIG.2, the manufacture method provided by the embodiment of the present invention comprises steps of:

step S1, providing a substrate 11 and forming a buffer layer 12 on the substrate 11.

Specifically, a silicon nitride layer 121 and a silicon oxide layer 122 are sequentially formed on the substrate to be the buffer layer 12.

step S2, forming a semiconductor pattern layer 13 and a first insulative layer 14, and the semiconductor pattern layer 13 and the first insulative layer 142 are located in the same layer and heights of the semiconductor pattern layer 13 and the first insulative layer 142 are the same.

The step specifically is: first, an amorphous silicon layer 133 is formed on the buffer layer 12, and specifically, the amorphous silicon layer 133 is formed on the silicon oxide layer 122 in this embodiment. Then, crystallization operation is implemented to the amorphous silicon layer 133 to form a polysilicon layer 134. Specifically, the crystallization can be accomplished by Excimer Laser Annealing (ELA), and then, the amorphous silicon layer 134 is patterned with a first photolithography process to form the semiconductor pattern layer 13. Furthermore, a silicon nitride layer 14, of which a height is the same as the height of the semiconductor pattern layer 13 is formed on the semiconductor pattern layer 13 and the buffer layer 12 where the semiconductor pattern layer 13 is not formed, specifically on the silicon oxide layer 122. Negative photoresist 141 is coated on the silicon nitride layer 14 at a location not corresponding to the semiconductor pattern layer 13, and the silicon nitride layer 14 is patterned with a second photolithography process. Furthermore, the silicon nitride layer 14 on the semiconductor pattern layer is etched to etching remove the silicon nitride layer 14 on the semiconductor pattern layer 13 for forming the first insulative layer 142, of which a height is the same as the height of the semiconductor pattern layer 13 at two ends of the semiconductor pattern layer 13.

The step of patterning the amorphous silicon layer 134 with a first photolithography process specifically is, first, a photoresist is coated on the amorphous silicon layer 134, and then, exposure and development, etc. are implemented to remove the redundant amorphous silicon layer 134. It is understandable that the principle of the following photolithography processes is the same as the first photolithography process unless specific claims.

After the first insulative layer 142 is formed, a normal area 130 and heavy doped areas 131 at two sides of the normal area 130 are further formed on the semiconductor pattern layer 13 with a third photolithography process and a first doping process; a light doped area 132 between the normal area 130 and the heavy doped areas 131 is further formed on the semiconductor pattern layer 13 with a fourth photolithography process and a second doping process.

The heavy doped areas 131 and the light doped area 132 are both N type doped with ion implantation. The differences are doped with different ratios.

The method of this embodiment further comprises: forming a second insulative layer 15 on the semiconductor pattern layer 13 and the first insulative layer 142. forming a gate layer 16 on the second insulative layer 15. Because the heights of the semiconductor pattern layer 13 and the first insulative layer 142 are the same, the surface of the second insulative layer 15 can be in a flat state. Thus, the uneven surface can be erased for the second insulative layer 15. For instance, side effects can occur due to some convex structures which make an uneven gap between the gate layer 16 and the semiconductor pattern layer 13. Accordingly, the following transmission of signals can be more stable and promote the electrical property of the LTPS TFT pixel unit.

In this embodiment of the present invention, the gate layer 16 is further implemented with a fifth photolithography process to form a gate 161. Furthermore, a third insulative layer 17 on the gate 161, wherein in this embodiment, the third insulative layer 17 comprises a silicon oxide layer 171 and a silicon nitride layer 172.

Furthermore, a source 18 and a drain 19 of the LTPS TFT unit 10 are formed on the third insulative layer 17, wherein the formation of the source 18 and the drain 19 are similar with that of the gate 161. The repeated description is omitted here. In this embodiment, the source 18 and the drain 19 are respectively connected to the semiconductor pattern layer 13 with first via holes M1 penetrating the second insulative layer 15 and the third insulative layer 17.

Furthermore, a fourth insulative layer 110 is formed on the source 18 and the drain 19, and a pixel electrode 100 is formed on the fourth insulative layer 110, and the pixel electrode 100 is electrically connected to one of the source 18 and the drain 19 with a second via hole M2 penetrating the fourth insulative layer 110. In this embodiment, the pixel electrode 100 is electrically connected to the drain 19. In other embodiments, the pixel electrode 100 can be electrically connected to the source 18.

Furthermore, a fifth insulative layer 120 is formed between the fourth insulative layer 110 and the source 18, the drain 19. Furthermore, a common electrode 130 is formed between the fifth insulative layer 120 and the fourth insulative layer 110, and employed to form a liquid crystal capacitor with the pixel electrode 100.

Consequently, the LTPS TFT pixel unit 10 manufactured by the method according to the embodiment of the present invention possesses smaller side effect and higher electrical property.

On the basis of the aforesaid method, the embodiment of the present invention further provides a LTPS TFT pixel unit. Please refer FIG. 3 for specification.

Figure 3:
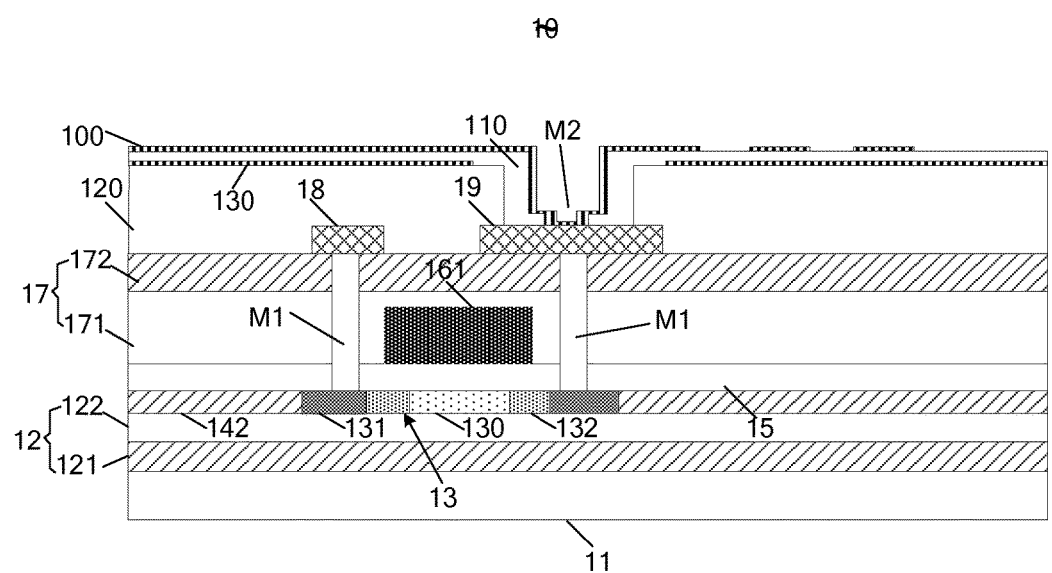
FIG. 3 is a structural diagram of a TFT pixel unit provided by the embodiment of the present invention.

As shown in FIG. 3, the LTPS TFT pixel unit 10 provided by the embodiment of the present invention comprises a substrate 11, a buffer layer 12, a semiconductor pattern layer 13 and a first insulative layer 142.

The buffer layer 12 comprises a silicon nitride layer 121 and a silicon oxide layer 122, and the silicon nitride layer 121 and a silicon oxide layer 122 are sequentially formed on the substrate 11.

The semiconductor pattern layer 13 and the first insulative layer 142 are located in the same layer which is on the silicon oxide layer 122, and heights of the semiconductor pattern layer 13 and the first insulative layer 142 are the same. The manufacture of the semiconductor pattern layer 13 and the first insulative layer 142 is described as aforementioned. The repeated description is omitted here.

In this embodiment, the semiconductor pattern layer 13 further comprises a normal area 130 and heavy doped areas 131 at two sides of the normal area 130. Furthermore, the semiconductor pattern layer 13 further comprises a light doped area 132 between the normal area 131 and the heavy doped areas 132.

Furthermore, the LTPS TFT pixel unit 10 further comprises a second insulative layer 15, a gate 161, a third insulative layer 17, a source 18, a drain 19, a fourth insulative layer 110 and a pixel electrode 100.

The second insulative layer 15 is located on the semiconductor pattern layer 13 and the first insulative layer 142. The gate 161 is located on the second insulative layer 15. The third insulative layer 17 comprises a silicon oxide layer 171 and a silicon nitride layer 172, sequentially located on the gate 161. The source 18 and the drain 19 are located on the third insulative layer 17 and the source 18 and the drain 19 are respectively connected to the semiconductor pattern layer 13 with first via holes M1 penetrating the second insulative layer 15 and the third insulative layer 17. The fourth insulative layer 110 is located on the source 18 and the drain 19. The pixel electrode 100 is located on the fourth insulative layer 110, and electrically connected to one of the source 18 and the drain 19 with a second via hole M2 penetrating the fourth insulative layer 110.

Furthermore, the LTPS TFT pixel unit 10 further comprises a fifth insulative layer 120 and a common electrode 130. The fifth insulative layer 120 is located between the fourth insulative layer 110 and the source 18, the drain 19. The common electrode 130 is located between the fifth insulative layer 120 and the fourth insulative layer 110, and employed to form a liquid crystal capacitor with the pixel electrode 100.

In conclusion, the present invention can reduce the side effect of the LTPS TFT pixel unit 10 and raise the electrical property.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a LTPS TFT pixel unit, wherein the method comprises steps of:
   providing a substrate and forming a buffer layer on the substrate;
   forming a semiconductor pattern layer and a first insulative layer, and the semiconductor pattern layer and the first insulative layer are located in the same layer and heights of the semiconductor pattern layer and the first insulative layer are the same;
   wherein the step of forming a buffer layer on the substrate comprises:
   sequentially forming a silicon nitride layer and a silicon oxide layer on the substrate;
   the step of forming a semiconductor pattern layer and a first insulative layer on the buffer layer, and the semiconductor pattern layer and the first insulative layer are located in the same layer and heights of the semiconductor pattern layer and the first insulative layer are the same comprises:

forming an amorphous silicon layer on the buffer layer, and implementing crystallization operation to the amorphous silicon layer to form a polysilicon layer;

patterning the amorphous silicon layer with a first photolithography process to form the semiconductor pattern layer;

forming a silicon nitride layer, of which a height is the same as the height of the semiconductor pattern layer on the semiconductor pattern layer and the buffer layer where the semiconductor pattern layer is not formed;

coating negative photoresist on the silicon nitride layer at a location not corresponding to the semiconductor pattern layer;

patterning the silicon nitride layer with a second photolithography process;

further etching the silicon nitride layer on the semiconductor pattern layer to remove the silicon nitride layer on the semiconductor pattern layer for forming the first insulative layer, of which a height is the same as the height of the semiconductor pattern layer at two ends of the semiconductor pattern layer.

2. The method according to claim 1, wherein the method further comprises:

forming a normal area and heavy doped areas at two sides of the normal area on the semiconductor pattern layer with a third photolithography process and a first doping process;

further forming a light doped area between the normal area and the heavy doped areas on the semiconductor pattern layer with a fourth photolithography process and a second doping process.

3. The method according to claim 2, wherein the method further comprises:

forming a second insulative layer on the semiconductor pattern layer and the first insulative layer;

forming a gate layer on the second insulative layer, and patterning the gate layer with a fifth photolithography process to form a gate;

forming a third insulative layer on the gate;

forming a source and a drain of the LTPS TFT unit on the third insulative layer, wherein the source and the drain are respectively connected to the semiconductor pattern layer with first via holes penetrating the second insulative layer and the third insulative layer;

forming a fourth insulative layer on the source and the drain, and forming a pixel electrode on the fourth insulative layer, and the pixel electrode is electrically connected to one of the source and the drain with a second via hole penetrating the fourth insulative layer.

4. The method according to claim 3, wherein the method further comprises:

further forming a fifth insulative layer between the fourth insulative layer and the source, the drain;

further forming a common electrode between the fifth insulative layer and the fourth insulative layer, employed to form a liquid crystal capacitor with the pixel electrode.

5. A manufacture method of a LTPS TFT pixel unit, wherein the method comprises steps of:

providing a substrate and forming a buffer layer on the substrate;

forming a semiconductor pattern layer and a first insulative layer on the buffer layer, and the semiconductor pattern layer and the first insulative layer are located in the same layer and heights of the semiconductor pattern layer and the first insulative layer are the same;

wherein the step of forming a semiconductor pattern layer and a first insulative layer on the buffer layer, and the semiconductor pattern layer and the first insulative layer are located in the same layer and heights of the semiconductor pattern layer and the first insulative layer are the same comprises:

forming an amorphous silicon layer on the buffer layer, and implementing crystallization operation to the amorphous silicon layer to form a polysilicon layer;

patterning the amorphous silicon layer with a first photolithography process to form the semiconductor pattern layer;

forming a silicon nitride layer, of which a height is the same as the height of the semiconductor pattern layer on the semiconductor pattern layer and the buffer layer where the semiconductor pattern layer is not formed;

coating negative photoresist on the silicon nitride layer at a location not corresponding to the semiconductor pattern layer;

patterning the silicon nitride layer with a second photolithography process;

further etching the silicon nitride layer on the semiconductor pattern layer to remove the silicon nitride layer on the semiconductor pattern layer for forming the first insulative layer, of which a height is the same as the height of the semiconductor pattern layer at two ends of the semiconductor pattern layer.

6. The method according to claim 5, wherein the step of forming a buffer layer on the substrate comprises:

sequentially forming a silicon nitride layer and a silicon oxide layer on the substrate.

7. The method according to claim 5, wherein the method further comprises:

forming a normal area and heavy doped areas at two sides of the normal area on the semiconductor pattern layer with a third photolithography process and a first doping process;

further forming a light doped area between the normal area and the heavy doped areas on the semiconductor pattern layer with a fourth photolithography process and a second doping process.

8. The method according to claim 7, wherein the method further comprises:

forming a second insulative layer on the semiconductor pattern layer and the first insulative layer;

forming a gate layer on the second insulative layer, and patterning the gate layer with a fifth photolithography process to form a gate;

forming a third insulative layer on the gate;

forming a source and a drain of the LTPS TFT unit on the third insulative layer, wherein the source and the drain are respectively connected to the semiconductor pattern layer with first via holes penetrating the second insulative layer and the third insulative layer;

forming a fourth insulative layer on the source and the drain, and forming a pixel electrode on the fourth insulative layer, and the pixel electrode is electrically connected to one of the source and the drain with a second via hole penetrating the fourth insulative layer.

9. The method according to claim 8, wherein the method further comprises:

further forming a fifth insulative layer between the fourth insulative layer and the source, the drain;

further forming a common electrode between the fifth insulative layer and the fourth insulative layer, employed to form a liquid crystal capacitor with the pixel electrode.

10. A LTPS TFT pixel unit, wherein the LTPS TFT pixel unit comprises:
- a substrate;
- a buffer layer, located on the substrate;
- a semiconductor pattern layer and a first insulative layer, located in the same layer and heights of the semiconductor pattern layer and the first insulative layer are the same;
- a second insulative layer, located on the semiconductor pattern layer and the first insulative layer;
- a gate, located on the second insulation layer;
- a third insulative layer, located on the gate;
- a source and a drain, located on the third insulative layer, wherein the source and the drain are respectively connected to the semiconductor pattern layer with first via holes penetrating the second insulative layer and the third insulative layer;
- a fourth insulative layer, located on the source and the drain;
- a pixel electrode, located on the fourth insulative layer, and the pixel electrode is electrically connected to one of the source and the drain with a second via hole penetrating the fourth insulative layer;
- a fifth insulative layer, located between the fourth insulative layer and the source, the drain; and
- a common electrode, located between the fifth insulative layer and the fourth insulative layer, and employed to form a liquid crystal capacitor with the pixel electrode.

11. The LTPS TFT pixel unit according to claim 10, wherein the buffer layer comprises a silicon nitride layer and a silicon oxide layer sequentially formed on the substrate.

\* \* \* \* \*